United States Patent
Peddi et al.

(10) Patent No.: US 9,607,896 B2
(45) Date of Patent: Mar. 28, 2017

(54) USE OF REPELLENT MATERIAL TO PROTECT FABRICATION REGIONS IN SEMI CONDUCTOR ASSEMBLY

(71) Applicant: HENKEL IP & HOLDING GMBH, Duesseldorf (DE)

(72) Inventors: Raj Peddi, Irvine, CA (US); Jeffrey Gasa, Long Beach, CA (US); Kenji Kuriyama, Yokohama (JP); Hoseung Yoo, Cypress, CA (US)

(73) Assignee: HENKEL IP & HOLDING GMBH, Duesseldorf (DE)

( * ) Notice: Subject to any disclaimer, the term of this patent is extended or adjusted under 35 U.S.C. 154(b) by 5 days.

(21) Appl. No.: 14/146,101

(22) Filed: Jan. 2, 2014

(65) Prior Publication Data
US 2014/0113435 A1 Apr. 24, 2014

Related U.S. Application Data

(63) Continuation of application No. PCT/US2012/044968, filed on Jun. 29, 2012.

(60) Provisional application No. 61/503,769, filed on Jul. 1, 2011.

(51) Int. Cl.
*H01L 21/78* (2006.01)
*H01L 21/683* (2006.01)
*H01L 23/00* (2006.01)

(52) U.S. Cl.
CPC .......... *H01L 21/78* (2013.01); *H01L 21/6836* (2013.01); *H01L 24/27* (2013.01); *H01L 24/29* (2013.01); *H01L 24/94* (2013.01); *H01L 2221/6834* (2013.01); *H01L 2221/68327* (2013.01); *H01L 2221/68381* (2013.01); *H01L 2224/27009* (2013.01); *H01L 2224/27416* (2013.01); *H01L 2224/27848* (2013.01); *H01L 2224/2919* (2013.01); *H01L 2224/83191* (2013.01); *H01L 2224/83856* (2013.01); *H01L 2224/94* (2013.01); *H01L 2924/12042* (2013.01)

(58) Field of Classification Search
None
See application file for complete search history.

(56) References Cited

U.S. PATENT DOCUMENTS

| | | | |
|---|---|---|---|
| 6,582,983 B1 | 6/2003 | Runyon et al. | |
| 6,958,256 B2 | 10/2005 | Rogalli et al. | |
| 7,074,695 B2 | 7/2006 | Park et al. | |
| 7,226,812 B2 | 6/2007 | Lu et al. | |
| 2004/0092108 A1* | 5/2004 | Yajima et al. | 438/689 |
| 2004/0266940 A1* | 12/2004 | Issari | 524/500 |
| 2005/0170612 A1* | 8/2005 | Miyanari et al. | 438/459 |
| 2006/0046433 A1 | 3/2006 | Sterrett et al. | |
| 2006/0088983 A1* | 4/2006 | Fujisawa | H01L 21/67092 438/462 |
| 2006/0105544 A1* | 5/2006 | Takanashi et al. | 438/460 |
| 2007/0049716 A1* | 3/2007 | Sayre | 528/26 |
| 2008/0027199 A1 | 1/2008 | Mazurek et al. | |
| 2008/0064815 A1 | 3/2008 | Issari et al. | |
| 2008/0237896 A1 | 10/2008 | Cho | |
| 2008/0262188 A1* | 10/2008 | Xie et al. | 528/98 |
| 2009/0261388 A1* | 10/2009 | Hendricks | H01L 21/78 257/288 |
| 2010/0019399 A1 | 1/2010 | Kimura et al. | |
| 2010/0044873 A1* | 2/2010 | Kameyama | H01L 21/78 257/773 |
| 2010/0244284 A1 | 9/2010 | Yang et al. | |
| 2010/0273312 A1 | 10/2010 | Noda | |
| 2011/0263097 A1* | 10/2011 | Yoshimura | H01L 21/6836 438/463 |
| 2012/0040510 A1 | 2/2012 | Yoo | |

FOREIGN PATENT DOCUMENTS

| | | |
|---|---|---|
| CN | 101560286 A | 10/2009 |
| JP | 62152672 A | 7/1987 |
| JP | 2001176822 A | 6/2001 |
| JP | 2005028734 A | 2/2005 |
| WO | 2008001706 A1 | 1/2008 |
| WO | WO 2008069805 A1 * | 6/2008 .......... H01L 21/563 |
| WO | WO 2009152221 A1 * | 12/2009 |
| WO | 2010124179 A2 | 10/2010 |
| WO | 2011128319 A1 | 10/2011 |
| WO | 2013006442 A2 | 1/2013 |

\* cited by examiner

*Primary Examiner* — Charles Garber
*Assistant Examiner* — Alia Sabur
(74) *Attorney, Agent, or Firm* — James J. Cummings

(57) ABSTRACT

A method of preparing semiconductor dies from a semiconductor wafer having a plurality of fabrication regions separated by dicing lines on the top side of the wafer, and an adhesive coating on the back side of the wafer, comprises applying a repellent material to the fabrication regions and dicing lines where the adhesive coating is not intended to be printed; applying the adhesive coating to the back side of the wafer; removing the repellent material; and separating the wafer along the dicing lines into individual dies.

7 Claims, No Drawings

USE OF REPELLENT MATERIAL TO PROTECT FABRICATION REGIONS IN SEMI CONDUCTOR ASSEMBLY

BACKGROUND OF THE INVENTION

This invention relates to a process for the fabrication of a semiconductor die.

In a conventional process for fabricating semiconductor dies, a semiconductor wafer is processed to form a plurality of circuits on the top side of the wafer, and in later steps, the wafer is separated into individual dies along prescribed dicing streets or lines, each having at least one circuit on its top side. The individual dies are used in semiconductor packages or on circuit boards and are attached to their substrates by adhesive. In addition to the usual semiconductor circuitry on the wafers, some wafers are fabricated with through-silicon-vias, micro bumps and other fabrication elements.

Miniaturization and slimming of electrical and electronic equipment has led to a need for thinner semiconductor dies. One way to produce thinner semiconductor dies is to remove excess material from the back side of the wafer, the side without any circuitry, before the wafer is separated into the individual dies. This removal is typically done by a grinding process and is known as back side grinding, although it can be anticipated that methods other than grinding might be used. After grinding, the thin wafers are then singulated into individual dies, either by mechanical or laser sawing. For very thin wafers (<50 um), there are potential problems with this standard process. Very thin wafers are brittle and tend to warp. In addition, sawing such thin wafers may result in back side or front side chipping, or side wall cracking.

It is more efficient to apply the adhesive for attaching the individual dies to substrates at the wafer level, rather than to the individual dies. Thus, in one fabrication method, the adhesive is applied to the back side of the wafer and is known as a wafer back side coating adhesive.

In order to prevent the cracking of thinned dies during the dicing operation, dicing lines may be partially cut or lasered into the top side of the full thickness wafer between adjacent circuits for the purpose of facilitating later singulation. After the dicing lines are partially cut, a protection tape (also known as a back grinding tape) is laminated to the top side of the wafer to protect the circuitry, and material from the back side of the wafer is removed to the level at which the dicing lines were cut. Once the protection tape is removed, this process results in singulated dies without the need for dicing the thinned wafers, and is known as dicing before grinding.

One drawback to this process is that wafer applied adhesives, such as film, may need further dicing once they are applied to the back of the wafer, which has already been singulated into individual dies. Alternately, if a wafer backside coating adhesive is applied, the coating will enter and contaminate the dicing lines or streets, interfering with the separation process and potentially contaminating the front side of the chips. This creates a need for a means of preventing contamination of the wafer back side coating into the dicing lines between the circuits if a partial dicing operation is done before the grinding down operation to thin the wafer.

SUMMARY OF THE INVENTION

This invention is a method for preparing semiconductor dies from a semiconductor wafer having a plurality of fabrication regions separated by dicing lines on the top side of the wafer, and an adhesive coating on the back side of the wafer, comprising applying a repellent material to the fabrication regions and dicing lines where the adhesive coating is not intended to be printed, applying the adhesive coating to the back side of the wafer; removing the repellent material, and separating the wafer along the dicing lines into individual dies. Within this specification and the claims, the term "fabrication regions" will include circuitry, through-silicon-vias, micro bumps and other fabrication elements on the semiconductor.

DETAILED DESCRIPTION OF THE INVENTION

The essence of the current invention is the use of a repellent material to block contamination of the dicing lines and fabrication regions by adhesives and coatings used in the fabrication process, and in particular, by wafer back side coatings. In a typical process to prepare individual semiconductor dies from a semiconductor wafer, the wafer is fabricated with circuitry, and in some embodiments with through-silicon-vias, microbumps, and other elements, on its top surface; dicing lines or streets are scribed into the surface between adjacent fabrication regions in those areas where singulation into individual dies is to occur.

If the wafer is to be thinned, a protective tape, called a back grinding tape, is laminated over the top surface of the wafer to protect the fabrication regions and the back side of the wafer is thinned to a predetermined depth.

In a next stage, the wafer back side adhesive or coating is applied to the back side of the wafer and B-staged. B-staging is the term used for partially curing an adhesive or coating or for evaporating off solvent so that the adhesive hardens without curing.

To prepare the wafer for dicing, a support dicing tape is applied to the back side of the wafer over the B-staged adhesive or coating, the back grinding tape is removed, and the wafer is separated into individual dies. The separation can take place by blade or laser dicing, or in some embodiments, the separation takes place by stretching the dicing tape to mechanically separate the dies.

In the instant invention, a material to repel the adhesive back side coating is applied into the dicing lines and over the top surface of the wafer in an amount sufficient to plug the dicing lines before the back grinding protection tape is laminated to the top side of the wafer. The adhesive repellent material is allowed to harden or set and then the back grinding protection tape is laminated onto the top side of the wafer and over the hardened adhesive repellent material.

The wafer is thinned, and an adhesive coating is applied to the back side of the wafer. The adhesive back side coating is repelled by the adhesive repellent material and will not enter the dicing streets or those areas where the repellent material was applied. The adhesive wafer back side coating is B-staged and a dicing tape is applied on top of the B-staged adhesive. The back grinding protection tape is removed from the top side of the wafer and the repellent material is now cleaned from the top side of the wafer. The wafer can then be separated along the dicing lines into individual dies.

The formation of the plurality of circuits on the top side of the wafer is made according to semiconductor fabrication methods well documented in industry literature. The wafer is a semiconductor material, typically silicon. The circuits can be formed below, on, or above the top surface of the wafer, and can be protected by coatings, such as, passivation layers. The dicing lines formed into the top side of the wafer between the individual circuits are also known as dicing streets or trenches. These can be formed prior to or concurrently with the circuit formation. The means for forming the dicing lines include, for example, wet or dry etching, and laser drilling. The purpose of the dicing lines is to facilitate and guide the dicing of the wafer into individual semiconductor dies.

The application of an adhesive repellent material into the dicing lines and fabrication regions is done to repel the later applied wafer back side coating and prevent its ingress into the un-intended regions. The adhesive repellent material is selected so that it repels the wafer back side coating chosen to be applied as adhesive to the back side of the wafer. The adhesive repellent material is applied in an effective amount to protect the dicing streets and fabrication regions and can be a water soluble or organic solvent soluble repellent.

Suitable water soluble repellent materials include hydrophilic polymers selected from the group consisting of polyvinyl alcohol, water-soluble cellulosics, gelatin, starches and polysaccharides, polyethylene oxides, polyvinyl pyrollidone, sulfonated polystyrenes, and polymers derived from ethylenically unsaturated monomers containing hydrophilic groups. Suitable organic solvent soluble repellent materials are selected from the group consisting of waxes and fluorinated waxes; solid hydrogenated oils; polyolefins; acrylate, methacrylate, and styrenic polymers; and silicone compounds.

In one embodiment the repellent material is the reaction product of a composition A comprising (i) one or more crosslinkable polyorganosiloxanes which form an elastomer when cured, and (ii) polymeric particles that are distributed within said one or more crosslinkable polyorganosiloxanes, that remain discrete in the cured elastomer, and that have a melting temperature below the degradation temperature of the cured elastomer.

As used in the present invention, the term "melting temperature" of the polymeric particles preferably refers to the temperature at which the polymeric particles undergo a change of state from a solid to liquid. The melting temperature can be determined by DSC where the melting temperature is defined as the inflection point of the DSC curve.

As used in the present invention, the term "degradation temperature" of the cured elastomer refers to the temperature at which the elastomer undergoes a weight loss of more than 10 wt. %, preferably more than 20 wt. %. The degradation temperature can be determined by TGA (Thermogravimetric Analysis).

Among useful polymeric particles are polymeric powders, wherein the polymeric particles are preferably selected from polyolefins and/or copolyolefins, such as polyethylene, polypropylene, polyethylene-co-propylene, polybutadiene, polycapralactone, isotactic poly(1-butene), syndiotactic polypropylene, poly(1-decene), poly(ethylene-co-1-butene), poly(ethylene-co-vinylacetate), polybutylene adipic acid), poly(α-methyl styrene-co-methylstyrene), polyethylene oxide, trans-1,4-polybutadiene or trans-1,4-polyisoprene.

The particle size of the polymeric particles of the present invention may vary widely, such as, for example, from 50 nm up to about 100 μm. In one embodiment, the polymeric particles have a size range of about 5 μm to about 10 μm. The particle size can be determined by laser diffraction using a Mastersizer 2000 (produced by Malvern instruments Ltd, calculation according to Mie).

The term "particle size", as used in the present invention, refers to the $d_{50}$ volume average particle diameter. The $d_{50}$ volume average particle diameter is defined as that particle diameter at which 50% by volume of the particles have a larger diameter than the $d_{50}$ value.

The polymeric particles are distributed within the crosslinkable polyorganosiloxanes of composition A in a shape-holding amount, preferably in an amount of 1% to 80% by weight, more preferably in an amount of 20% to 60% by weight, and particularly preferably in an amount of 30% to 50% by weight, based on the total amount of the curable composition A.

In another embodiment the shape memory polymer used in the method of the present invention is the cured product of a composition B, comprising (i) one or more crosslinkable polyorganosiloxanes which form an elastomer when cured, and (ii) one or more (meth)acrylic acid esters.

As used herein, the term "(meth)acrylic acid esters" is intended to include methacrylic acid esters and acrylic acid esters, and reference to one of methacrylates or acrylates is intended to embrace the other as well, unless specifically noted otherwise.

The incorporation of the (meth)acrylic acid esters (here liquid filler) in to the curable composition B, followed by the curing of the (meth)acrylic acid esters lead to phase separation, thereby forming polymeric (meth)acrylate domains in the cured product of composition B.

The (meth)acrylic acid esters may be selected from a wide variety of compounds. A desirable class of (meth)acrylic acid esters useful as liquid fillers in composition B include poly- and/or mono-functional (meth)acrylic acid esters. One class of (meth)acrylic acid esters useful in the present invention have the general structure:

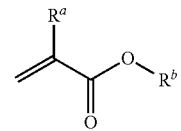

where $R^a$ is H, halogen, or $C_1$ to $C_{20}$ hydrocarbyl; and $R^b$ is H or $C_1$ to $C_{20}$ hydrocarbyl. Desirably $R^b$ is at least $C_4$ or greater.

As used herein, the term "hydrocarbyl" (hydrocarbon group) is intended to refer to branched and unbranched radicals or diradicals, respectively, which are primarily composed of carbon and hydrogen atoms. Thus, the terms encompass aliphatic groups such as alkyl, alkenyl, and alkynyl groups; aromatic groups such as phenyl; and alicyclic groups such as cycloalkyl and cycloalkenyl. Hydrocarbon radicals of the invention may include heteroatoms to the extent that the heteroatoms do not detract from the hydrocarbon nature of the groups. Accordingly, hydrocarbon groups may include such functionally groups as ethers, alkoxides, carbonyls, esters, amino groups, cyano groups, sulfides, sulfates, sulfoxides, sulfones, and sulfones.

The hydrocarbon radicals and diradicals of the present invention may be optionally substituted to the extent that the substituent does not detract from the hydrocarbon nature of the hydrocarbyl group. As used herein the term "optionally substituted" is intended to mean that one or more hydrogens on a group may be replaced with a corresponding number of substituents preferably selected from halogen, nitro, azido, amino, carbonyl, ester, cyano, sulfide, sulfate, sulfoxide, sulfone, and/or sulfone groups.

Other desirable (meth)acrylic acid esters of composition B are urethane (meth)acrylates having the general structure:

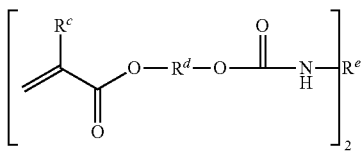

where $R^c$ is H, $C_1$ to $C_4$ alkyl, or halogen; $R^d$ is (i) a $C_1$ to $C_8$ hydroxyalkylene or aminoalkylene group, or (ii) a $C_1$ to $C_6$ alkylamino-$C_1$ to $C_8$ alkylene, a hydroxyphenylene, aminophenylene, hydroxynaphthalene or amino-naphthalene optionally substituted by $C_1$ to $C_3$ alkyl, $C_1$ to $C_3$ alkylamino or di-$C_1$ to $C_3$ alkylamino group; and $R^e$ is $C_2$ to $C_{20}$ alkylene, $C_2$ to $C_{20}$ alkenylene or $C_2$ to $C_{20}$ cycloalkylene, $C_6$ to $C_{40}$ arylene, alkarylene, $C_2$ to $C_{40}$ aralkarylene, $C_2$ to $C_{40}$ alkyloxyalkylene or $C_2$ to $C_{40}$ aryloxyarylene, optionally substituted by 1 to 4 halogen atoms or by 1 to 3 amino or mono- or di-$C_1$ to $C_3$ alkylamino or $C_1$ to $C_3$ alkoxy groups.

Other desirable (meth)acrylic acid esters, include, without limitation, urethane (meth)acrylates within the general structure:

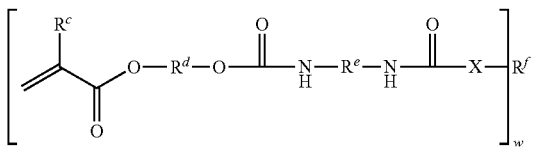

where $R^c$, $R^d$, and $R^e$ are as described herein above and $R^f$ is an w-valent residue obtained by the removal of w amino or hydroxy groups from a polyamine or a polyhydric alcohol having at least two amino or hydroxy groups; X is O or $NR^g$ where $R^g$ is H or $C_1$ to $C_7$ alkyl; and w is an integer from 2 to 20.

Suitable monofunctional (meth)acrylic acid esters are selected from isobornyl (meth)acrylate, adamantly (meth) acrylate, dicyclopentenyl (meth)acrylate, trimethylcyclohexyl (meth)acrylate, cyclohexyl (meth)acrylate, n-octyl (meth)acrylate, iso-octyl (meth)acrylate, n-nonyl (meth) acrylate, iso-nonyl (meth)acrylate, n-decyl (meth)acrylate, iso-decyl (meth)acrylate, n-undecyl (meth)acrylate, iso-undecyl (meth)acrylate, n-dodecyl (meth)acrylate, iso-dodecyl (meth)acrylate, 2(2-ethoxyethoxy)ethylacrylate, and/or combinations thereof.

Advantageously, the (meth)acrylic acid ester may be isobornyl acrylate, iso-octyl acrylate, and/or isodecyl 2(2-ethyxyethoxy) ethylacrylate.

In one preferred embodiment the (meth)acrylic acid ester component of composition B comprises a combination of isobornyl (meth)acrylate with n-decyl (meth)acrylate, isobornyl (meth)acrylate with iso-decyl (meth)acrylate, isobornyl (meth)acrylate with n-undecyl (meth)acrylate, isobornyl (meth)acrylate with iso-undecyl (meth)acrylate, isobornyl (meth)acrylate with n-dodecyl (meth)acrylate, or isobornyl (meth)acrylate with iso-dodecyl (meth)acrylate.

Specific polyfunctional (meth)acrylic acid esters that are desirable include polyethylene glycol dimethacrylate and dipropylene glycol dimethacrylate.

Other desirable (meth)acrylic acid esters are selected from the acrylate, methacrylate and glycidyl methacrylate esters of bisphenol A. Desirable among these free-radical polymerizable components mentioned is ethoxylated bisphenol-A-dimethacrylate ("EBIPMA").

Mixtures of any of the above-mentioned (meth)acrylic acid esters may be employed in composition B.

One or more (meth)acrylic acid esters may be added in amounts of at least 5% by weight of the total composition B. Desirably, one or more (meth)acrylic acid esters are present in an amount of 15% to 80% by weight of the total composition B, and more desirably in an amount of 20% to 70% by weight of the total composition B.

As mentioned above, composition A as well as composition B comprises one or more crosslinkable polyorganosiloxanes, which form an elastomer when cured.

The crosslinkable polyorganosiloxanes used in the method of the present invention are preferably selected from curable silicone compositions. Various types of curable silicone compositions may be employed. For example, heat curing silicone compositions, moisture curing silicone compositions and photocuring silicone compositions may be employed. Polymodal curing silicone compositions, for example photo and moisture dual curing compositions or heat and moisture dual curing silicone compositions are also useful.

Suitable crosslinkable polyorganosiloxanes are selected from compounds of formula (I),

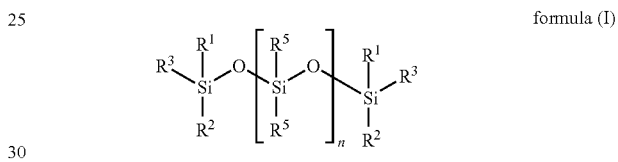

formula (I)

in which $R^1$, $R^2$ and $R^5$ independently of one another are selected from hydrogen, $C_{1-20}$ alkyl, $C_{1-20}$ alkoxyl or $C_{1-20}$ acyl; and $R^3$ is

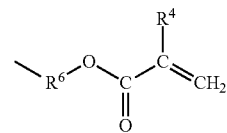

in which $R^6$ is $C_{1-20}$ hydrocarbyl, and $R^4$ is H or $C_{1-4}$ alkyl.

In another embodiment, the crosslinkable polyorganosiloxanes are selected from compounds of formula (II):

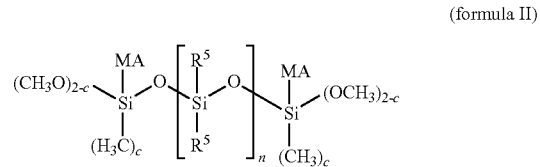

(formula II)

in which MA is a methacryloxypropyl group, n is from 1 to 1200 and c is 0 or 1; and each $R^5$ independently of one another is $C_{1-20}$ hydrocarbyl or $C_{1-20}$ hydrocarboxyl.

Examples of the above $R^1$, $R^2$, $R^3$, and $R^5$ groups are alkyl (e.g. methyl, propyl, butyl and pentyl), alkenyl (e.g. vinyl and allyl), cycloalkyl (e.g. cyclohexyl and cycloheptyl), aryl (e.g. phenyl), arylalkyl (e.g. betaphenylethyl), alkylaryl, and hydrocarbonoxy (e.g. alkoxy, aryloxy, alkaryloxy, aryalkoxy, and in particular, methoxy, ethoxy or hydroxyl). Any of the foregoing groups may have some or all of the hydrogen atoms substituted by a halogen, such as fluorine or chlorine.

The number of repeating units in the crosslinkable polyorganosiloxanes can be varied to achieve specific molecular weights, viscosities and other chemical or physical properties.

The crosslinkable polyorganosiloxanes may be present in amounts of about 20% to about 95% by weight, based on the total weight of the curable composition A or based on the total weight of the curable composition B.

In addition to the crosslinkable polyorganosiloxanes, the composition A and/or composition B may include one or more silicon hydride crosslinkers and/or one or more organo-metallic hydrosilation catalysts.

In one embodiment the silicon hydride crosslinkers are selected from compounds of formula (III)

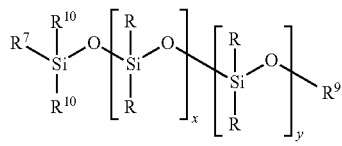

(formula III)

in which at least two of $R^7$, $R^9$ and $R^{10}$ are H; otherwise R, $R^7$, $R^9$, and $R^{10}$ are the same or different and are $C_{1-20}$ hydrocarbyl, preferably methyl; x is an integer from 10 to 1000; and y is an integer from 1 to 20.

One or more silicon hydride crosslinkers may be present in an amount sufficient to achieve the desired amount of crosslinking, and in one embodiment in an amount of 1% to 10% by weight, based on the total weight of the composition A or based on the total weight of the composition B.

Useful organo-metallic hydrosilation catalysts may be selected from any precious metal or precious metal-containing catalyst effective for initiating a thermal hydrosilation cure reaction. Especially useful are platinum and rhodium catalysts that are effective for catalyzing the addition reaction between silicone-bonded hydrogen atoms and silicone-bonded olefinic groups. Other classes of catalysts useful in the present invention include organo rhodium and platinum alcoholates. Complexes of ruthenium, palladium, osmium and iridium are also contemplated.

One or more organo metallic hydrosilation catalyst may be used in any effective amount to effectuate thermal curing. In one embodiment, the catalyst is present in amounts of 0.025% to 1.0% by weight, based on the total weight of composition A or based on the total weight of composition B.

Depending on the chemical nature of the crosslinkable polyorganosiloxane component of composition A or B and depending on the intended cure mechanism, each of said compositions A or B may include one or more initiators, wherein the terms "initiator" and "catalyst" are used interchangeably in the present invention.

Suitable initiators for use in the present method include moisture cure initiators, photoinitiators, free radical initiators, heat cure catalysts, and/or combinations thereof.

One or more initiators may be present in composition A or composition B in an amount of 0.01% to 10% by weight, preferably in an amount of 0.1% to 5% by weight, each based on the total weight of composition A or composition B.

A number of photoinitiators may be employed as part of composition A and/or composition B. Any known free radical type photoinitiator which promotes crosslinking, may be used in the method of the present invention. Photoinitiators enhance the rapidity of the curing process when the photocurable compositions as a whole are exposed to electromagnetic radiation.

Non-limiting examples of UV photoinitiators that are useful in composition A and/or composition B include pyruvates, acetophenones, phosphine oxides, benzoins, benzophenone, dialkoxy-benzophenones, Michler's ketone (4,4'-bis(dimethylamino)benzophenone), diethoxyacetophenone and/or any combination thereof.

In another embodiment of the present invention, the shape memory film used in the method of the present invention is the cured product of a composition C, comprising (i) one or more epoxy resins selected from aromatic epoxy resins, aliphatic epoxy resins, and/or combinations thereof, and (ii) one or more crosslinking agents selected from multi-amines, multi-carboxylic acids and anhydrides and/or combinations thereof.

Suitable aromatic epoxy resins include aromatic diepoxides, such as the diglycidyl ether of bisphenol A, which is commercially available under the tradename. EPON 826 from Hexion Speciality Chemicals.

Suitable aliphatic epoxy resins include aliphatic diepoxides, such as neopentyl glycol diglycidyl ether (NGDE), which is commercially available from TCI America.

In a particular preferred embodiment composition C comprises a combination of one or more aromatic epoxy resins with one or more aliphatic epoxy resins, wherein a mixture of diglycidyl ether of bisphenol A and neopentyl glycol diglycidyl ether (NGDE) is used as the epoxy resin component of composition C.

The term "multi-amines", as used in the present invention refers to compounds having at least two amine groups, whereas the term "multi-carboxylic acids", as used in the present invention, refers to compounds having at least two carboxylic acid groups.

Suitable initiators for composition C include alkoxylated di- or tri-amines, such as polypropylene glycol)bis(2-aminopropyl)ether, which is commercially available under the tradename Jeffamine D-230 from Hexion Specialty Chemicals and Huntsman.

The shape memory polymer film used in the method of the present invention can be prepared according to any method. Particularly preferred methods to prepare said shape memory polymer film are described in US patent application Nos. 2004/0266940 A1, 2008/0064815 A1, and 2008/0262188 A1, the disclosure of each of which being hereby expressly incorporated herein by reference in their entirety.

The repellent compounds are dissolved in the appropriate solvent (water or organic solvent) and applied by any effective method, for example, by spin coating, screen or stencil printing, or preferably by spray or jet printing. The concentration of the solution can be high as possible, but to a level that will allow successful application. The water or solvent is then evaporated off before proceeding to the next steps, allowing the repellent material to harden.

The lamination of a protection layer onto the top side of the wafer and over the repellent material is done to protect, the circuits during the subsequent wafer thinning step and to hold the circuits in place after the wafer is diced. The protection layer is typically in the form of a tape, and in a particular embodiment, in the form of a UV tape. The adhesive is initially tacky, and then upon irradiation, hardens for ease of release.

Any process effective to thin down the wafer can be used. In a particular embodiment, the back side of the wafer is subjected to a grinding operation. Typically, this backgrinding is done to a level to meet the depth of the dicing lines. In some operations the dicing lines are cut slightly deeper into the front side of the wafer than the target depth of the backside grinding. This slight over cutting facilitates the eventual separation of the individual dies.

After the back side thinning operation, an adhesive coating is applied to the back side of the wafer. This adhesive wafer back side coating is used to attach the individual dies to their substrates. The application of the wafer back side coating is performed by any effective method, such as by spin coating, screen or stencil printing, or spray or jet printing. The chemical composition of the wafer back side coating is any adhesive that will meet the subsequent processing requirements. Such adhesives are known in the art. In one embodiment the wafer back side coating is a B-stageable liquid, meaning it can be heated to remove solvent or UV photo-initiated to partially cure. After B-staging the wafer back side coating is relatively tack-free at room temperature. In the later die attach operation, the coating can be heated to soften and flow during die attach, and then be heated at an elevated temperature for final cure.

In this embodiment the chemistry of the wafer back side coating will be chosen so that it can be B-staged, and so that the repellent material in the fabrication regions will be able to repel the wafer back side coating adhesive.

In another embodiment the composition of the wafer back side coating is chosen so that it cures to a more brittle state. This brittle state allows the back side coating to be broken (rather than mechanically sawed or lasered) during singulation of the individual dies.

A support tape is applied on top of the B-staged coating on the back side of the wafer for subsequent handling purposes. After that, the protection (back grinding) tape from the top side of the wafer is removed.

The repellent material is then removed from the fabrication regions. If this is water soluble material, the surface of the wafer is washed with water until all traces of the material are removed. If this is a solvent soluble material, an appropriate solvent for dissolving the material is used to clean the surface until all traces of the material are removed. In some embodiments in which the above described silicone elastomer compositions are used, the repellent material mechanically and easily releases from the fabricated regions and dicing streets.

Finally, the wafer is separated into individual circuits along the dicing lines. This separation can be done by sawing with a blade, burning with a laser, by stretching the wafer back side coating if it were provided as a brittle material or by a combination of partial sawing or laser burning and stretching.

The use of repellent material in this process repels the wafer back side coating adhesive from the fabricated regions, preventing contamination.

The invention claimed is:

1. A method of preparing semiconductor dies from a semiconductor wafer having a plurality of fabrication regions separated by dicing lines on the top side of the wafer, and an adhesive coating on the back side of the wafer, comprising:
   partially dicing the wafer to a depth to form fabrication regions and dicing lines on the top side of the wafer;
   applying on the top side of the wafer a repellent material to the fabrication regions and partially diced lines to form plugged dicing lines where the adhesive coating is not intended to be printed, and allowing the repellent material to harden;
   laminating backgrinding tape onto the top side of the wafer and over the hardened repellent material, and backgrinding the back side of the wafer to meet the depth of the plugged dicing lines to expose portions of repellant material and form a supported set of dies;
   applying the adhesive coating to the back side of the supported set of dies and exposed portions of repellant material, wherein upon contact, the adhesive coating is chemically repelled off of the exposed portions of repellent material;
   partially curing the adhesive coating;
   laminating dicing tape onto the partially cured adhesive coating of the supported set of dies and removing the back grinding tape;
   removing the repellent material from the fabrication regions and plugged dicing lines; and
   separating the supported set of dies along the dicing lines into individual dies.

2. The method according to claim 1 in which the repellent material is a water soluble repellent material selected from the group consisting of polyvinyl alcohol, water-soluble cellulosics, gelatin, starches and polysaccharides, polyethylene oxides, polyvinyl pyrollidone, sulfonated polystyrenes, and polymers derived from ethylenically unsaturated monomers containing hydrophilic groups.

3. The method according to claim 1 in which the repellent material is an organic solvent soluble repellent material selected from the group consisting of waxes and fluorinated waxes, solid hydrogenated oils, polyolefins, acrylates, methacrylates, styrenic polymers, and silicone compounds.

4. The method according to claim 1 in which the repellent material is the reaction product of a composition comprising:
   (i) one or more crosslinkable polyorganosiloxanes that form an elastomer when cured, and
   (ii) polymeric particles that are distributed within said one or more crosslinkable polyorganosiloxanes, that remain discrete in the cured elastomer, and that have a melting temperature below the degradation temperature of the cured elastomer.

5. The method according to claim 1 in which the repellent material is the reaction product of a composition comprising
   (i) one or more crosslinkable polyorganosiloxanes that form an elastomer when cured, and
   (ii) one or more (meth)acrylic acid esters.

6. The method according to claim 1 in which the repellent material is the reaction product of a composition comprising
   (i) one or more epoxy resins selected from aromatic epoxy resins, aliphatic epoxy resins, and/or combinations thereof, and
   (ii) one or more crosslinking agents selected from multi-amines, multi-carboxylic acids and anhydrides and/or combinations thereof.

7. A method of preparing semiconductor dies from a semiconductor wafer having a plurality of fabrication regions separated by dicing lines on the top side of the wafer, and an adhesive coating on the back side of the wafer, consisting essentially of:
   partially dicing the wafer to a depth to form fabrication regions and dicing lines on the top side of the wafer;
   applying on the top side of the wafer a repellent material to the fabrication regions and partially diced lines to form plugged dicing lines where the adhesive coating is not intended to be printed, and allowing the repellent material to harden;
   laminating backgrinding tape onto the top side of the wafer and over the hardened repellent material, and backgrinding the back side of the wafer to meet the depth of the plugged dicing lines to expose portions of repellant material and form a supported set of dies;

applying the adhesive coating to the back side of the supported set of dies and exposed portions of repellant material, wherein upon contact, the adhesive coating is chemically repelled off of the exposed portions of repellent material;

partially curing the adhesive coating;

laminating dicing tape onto the partially cured adhesive coating of the supported set of dies and removing the back grinding tape;

removing the repellent material from the fabrication regions and plugged dicing lines; and separating the supported set of dies along the dicing lines into individual dies.

\* \* \* \* \*